US009818916B2

(12) United States Patent
Mueller et al.

(10) Patent No.: US 9,818,916 B2
(45) Date of Patent: Nov. 14, 2017

(54) INCANDESCENT-LIKE-DIMMING LIGHT EMITTING DIODE (71) Applicants: Gerd O. Mueller, San Jose, CA (US); Regina B. Mueller-Mach, San Jose, CA (US)

(72) Inventors: Gerd O. Mueller, San Jose, CA (US); Regina B. Mueller-Mach, San Jose, CA (US)

(*) Notice: Subject to any disclaimer, the term of this patent is extended or adjusted under 35 U.S.C. 154(b) by 0 days.

(21) Appl. No.: 15/254,734

(22) Filed: Sep. 1, 2016

(65) Prior Publication Data
US 2016/0372639 A1 Dec. 22, 2016

Related U.S. Application Data (63) Continuation of application No. PCT/US2015/043392, filed on Aug. 3, 2015.

(60) Provisional application No. 62/036,103, filed on Aug. 11, 2014.

(51) Int. Cl.
| H01L 33/50 | (2010.01) |
| H01L 33/32 | (2010.01) |
| C09K 11/61 | (2006.01) |
| C09K 11/62 | (2006.01) |
| C09K 11/77 | (2006.01) |
| H05B 33/08 | (2006.01) |

(52) U.S. Cl.
CPC .......... *H01L 33/504* (2013.01); *C09K 11/617* (2013.01); *C09K 11/62* (2013.01); *C09K 11/7774* (2013.01); *H01L 33/32* (2013.01); *H05B 33/0857* (2013.01); *Y02B 20/181* (2013.01)

(58) Field of Classification Search
CPC ..... H01L 33/504; H01L 33/32; C09K 11/617; C09K 11/62; C09K 11/7774; H05B 33/0857
USPC ....................................................... 315/291
See application file for complete search history.

(56) References Cited

U.S. PATENT DOCUMENTS

| 6,028,694 A * | 2/2000 | Schmidt ............... A61B 5/0084 |
| | | 315/246 |
| 7,514,860 B2 * | 4/2009 | Nagatomi ............. C04B 35/581 |
| | | 313/487 |
| 8,228,002 B2 | 7/2012 | Newman, Jr. et al. |
| 8,651,723 B2 | 2/2014 | Juestel et al. |
| 8,710,487 B2 * | 4/2014 | Lyons .................. C09K 11/617 |
| | | 257/13 |
| 8,729,589 B2 | 5/2014 | Hussell et al. |
| 9,142,732 B2 * | 9/2015 | Luo ........................ H01L 33/504 |
| 2010/0254129 A1 * | 10/2010 | Le Toquin ................ F21K 9/00 |
| | | 362/231 |
| 2011/0037376 A1 * | 2/2011 | Van Herpen et al. .... H01J 1/63 |
| | | 313/483 |
| 2013/0271960 A1 * | 10/2013 | Hong ................... C09K 11/616 |
| | | 362/97.1 |

(Continued)

OTHER PUBLICATIONS

International Search Report corresponding to PCT/US2015/043392, dated Oct. 28, 2015, 2 pages.

*Primary Examiner* — Dylan White
(74) *Attorney, Agent, or Firm* — Innovation Counsel LLP (57) ABSTRACT

Phosphor-converted light emitting diodes comprising a blue or near-UV emitting semiconductor device, a yellow-green phosphor, and a red phosphor exhibit incandescent-like dimming behavior in that the Correlated Color Temperature of a white light output decreases with reduced brightness.

23 Claims, 3 Drawing Sheets (56) References Cited

U.S. PATENT DOCUMENTS

| | | | |
|---|---|---|---|
| 2015/0008463 A1 | 1/2015 | Yoshida | |
| 2015/0028365 A1* | 1/2015 | Kurtin | H01L 33/501 257/88 |
| 2015/0108908 A1 | 4/2015 | Denvir | |
| 2015/0228868 A1* | 8/2015 | Ouderkirck | H01L 25/0753 362/84 |
| 2016/0172549 A1* | 6/2016 | Srivastava | H01L 33/504 257/98 |
| 2016/0276548 A1* | 9/2016 | Yoo | C09K 11/7792 |
| 2016/0304779 A1* | 10/2016 | Zych | C09K 11/7731 |

* cited by examiner

| CCT (Kelvin) | 2200 | 2438 | 2825 | 3250 | 3940 | 4574 |
|---|---|---|---|---|---|---|
| du'v' | 0.0000 | 0.00017 | 0.0039 | 0.0050 | 0.0045 | 0.0027 |
| Ra | 84.3 | 86.6 | 89.8 | 91.8 | 92.1 | 89.0 |
| R9 | 77.3 | 76.1 | 78.4 | 85.5 | 96.8 | 77.9 |

INCANDESCENT-LIKE-DIMMING LIGHT EMITTING DIODE

CROSS REFERENCE TO RELATED APPLICATIONS

This application is a Continuation of International Patent Application PCT/US2015/043392 filed Aug. 3, 2015 and titled "Incandescent-Like Dimming LED", which claims benefit of priority to U.S. Provisional Patent Application 62/036,103 filed Aug. 11, 2014 and titled "Incandescent-Like Dimming LED", both of which are incorporated herein by reference in their entirety.

FIELD OF THE INVENTION

The invention relates generally to phosphor-converted light emitting diodes, and more generally to phosphor-converted light emitting diodes that exhibit dimming behavior similar to that of incandescent light sources as output power is reduced by reducing driving power is reduced.

BACKGROUND

Although semiconductor light emitting diodes and laser diodes (both generally referred to herein as LEDs) occupy a growing share of the general lighting market, their adoption may be hindered by differences in their performance compared to the light sources they replace. For example, users, especially in the home lighting sector, are accustomed to and like to experience the dimming behavior of incandescent light bulbs, which both dim and shift in color to a lower color temperature "warmer" white as electric power to the light bulb is decreased. This behavior is not only typical of incandescent (typically tungsten filament) light bulbs, but is linked to radiation laws of physics and hence may be thought of as natural dimming. Reducing the temperature of the glowing filament in a light bulb by throttling the current passing through it not only changes light output, but also changes the spectrum of light emitted. The color temperature is decreased. LEDs and phosphor-converted LEDs generally do not behave in this manner.

Attempts to produce LED light sources with user-desired natural incandescent-like-dimming (ILD) behavior have involved, for example, designing that behavior into LED lamps or luminaires by using red-emitting, LEDs in combination with white LEDs. The red LEDs are powered up as the total power from the lamp or luminaire is ramped down, to red-shift the light output as it dims. These devices typically require at least three electrical contacts to their drive electronics. This approach adds complexity and cost to the drive electronics. Similarly, early attempts to achieve ILD behavior in fluorescent and compact fluorescent lamps also typically required complex driving circuitry.

SUMMARY

In one aspect, a light emitting device comprises an LED emitting blue light, a first phosphor excited by the blue light emitted by the LED and in response emitting green or greenish-yellow light, and a second phosphor excited by the blue light emitted by the LED and in response emitting red light. The second phosphor has a luminescence efficiency that is constant or approximately constant with (absorbed) excitation power from the LED. The emission from the LED, the first phosphor, and the second phosphor combine to provide a white light output having a Correlated Color Temperature. Emission power from the first phosphor increases linearly or approximately linearly with emission power from the LED. As emission power from the LED increases, emission power from the second phosphor saturates and the second phosphor transmits an increasing fraction of the blue light—an effect known as ground state depletion or bleaching in laser physics—thereby causing the Correlated Color Temperature of the white light output to increase as output power from the light emitting device increases.

In another aspect, a light emitting device comprises an LED emitting blue or near-UV light, a first phosphor excited by the light emitted by the LED and/or by light emitted by another phosphor excited by the LED and in response emitting green or greenish-yellow light, and a second phosphor excited by the light emitted by the LED, by the light emitted by the first phosphor, and/or by light emitted by another phosphor excited by the LED, and in response emitting red light. The second phosphor has a luminescence efficiency that is constant or approximately constant with (absorbed) excitation power. Emission power from the first phosphor increases linearly or approximately linearly with emission power from the LED. As emission power from the LED increases, emission power from the second phosphor saturates due to ground state depletion and the second phosphor transmits an increasing fraction of the light impinging on it thereby causing the Correlated Color Temperature of white light output from the light emitting device to increase as output power from the light emitting device increases.

In another aspect, a method of operating a light emitting device varies the Correlated Color Temperature of white light output from the device while maintaining a constant or approximately constant output power. The light emitting device comprises an LED and an LED driver supplying drive current to the LED in a train of current pulses each having an amplitude and a duty factor. The LED emits a train of blue or near-UV light pulses corresponding to the train of current pulses. The light emitting device further comprises a first phosphor excited by the light emitted by the LED and/or by light emitted by another phosphor excited by the LED and in response emitting green or greenish-yellow light, and a second phosphor excited by the light emitted by the LED, by the light emitted by the first phosphor, and/or by light emitted by another phosphor excited by the LED, and in response emitting red light. The second phosphor has a luminescence efficiency that is constant or approximately constant with (absorbed) excitation power. Emission power from the first phosphor increases linearly or approximately linearly with the current pulse amplitude of the drive current supplied to the LED. As the current pulse amplitude of the drive current supplied to the LED increases, emission power from the second phosphor saturates due to ground state depletion and the second phosphor transmits an increasing fraction of the light impinging on it.

The method comprises concurrently varying the current pulse amplitude and the duty factor to maintain a constant or approximately constant white light output power from the light emitting device while varying the Correlated Color Temperature of the white light.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention. As used in this specification and the appended claims, the singular forms "a," "an," and "the" include plural referents unless the context clearly indicates otherwise.

This specification discloses phosphor-converted LEDs which change their spectra when their drive current is changed, if it is reduced, exhibiting natural dimming (ND) much like an incandescent lamp. Advantageously, these may be simple two-terminal electrical devices. In these devices primary emission from a blue or near-ultra violet (near-UV) emitting LED excites two or more phosphors (e.g., a green or greenish/yellow phosphor and a red phosphor) which in response produce secondary emission. The sum of these secondary emissions with the remaining primary emission not absorbed by the phosphors is perceived by a human having normal color vision as white light. The Correlated Color Temperature (CCT) of this white light decreases with decreasing drive power to the LED and hence with decreasing total light output from the phosphor-converted LED.

In one approach a phosphor-converted LED comprises a green or greenish/yellow emitting phosphor in combination with a red emitting phosphor. The emission efficiency (i.e., quantum yield of emission) of the green or greenish/yellow phosphor is independent of excitation power from the blue or near-UV LED over the normal operating range of the phosphor-converted LED and emission power from the green or greenish/yellow phosphor increases (e.g., linearly or approximately linearly) with excitation power from the blue or near-UV LED over the normal operating range of the phosphor-converted LED. However, the emission efficiency of the red phosphor might decrease with increasing excitation power from the blue or near-UV LED over the normal operating range of the phosphor-converted LED. Consequently the emission power from the red phosphor initially increases with increasing excitation power but then levels off (saturates) at the upper end of the normal operating range of the phosphor-converted LED. As a result the total light output from the phosphor-converted LED shifts blue as drive power to the blue or near-UV LED is increased, and shifts red as drive power to the blue or near-UV LED is decreased.

The decreasing efficiency of the red phosphor at higher excitation may result, for example, from a non-radiative relaxation process that turns on at high pump powers to partially quench the red phosphor, or from some other loss mechanism that grows in importance at higher pump powers. A disadvantage to this approach is that the overall efficiency of the phosphor-converted LED in converting electricity to light decreases as drive power is increased. Hence this approach is disfavored.

In a preferable approach on which this specification focuses, a phosphor-converted LED again comprises a green or greenish/yellow emitting phosphor in combination with a red emitting phosphor. In this variation the emission efficiencies of both the green or greenish/yellow phosphor and the red phosphor are independent of excitation power from the blue or near-UV LED over the normal operating range of the phosphor-converted LED. Emission power from the green or greenish/yellow phosphor increases (e.g., linearly or approximately linearly) with excitation power from the blue or near-UV LED over the normal operating range of the phosphor-converted LED. However, the red emitting phosphor grows increasingly transparent to the primary emission from the LED (or if excited by another phosphor, to emission from that other phosphor) with increasing excitation power over the normal operating range of the phosphor-converted LED. This is because the red emitting phosphor has a long emission lifetime (e.g., $\geq 10^{-5}$ seconds, $\geq 10^{-4}$ seconds, $\geq 10^{-3}$ seconds, $\geq 10^{-2}$ seconds) which causes depletion of the red phosphor's ground electronic state (reversible bleaching of the phosphor) at higher pump powers. Consequently the emission power from the red phosphor initially increases with increasing excitation power but then levels off (saturates) at the upper end of the normal operating range of the phosphor-converted LED. Because the red phosphor's efficiency stays constant, there is no overall decrease in power output with increasing drive. Factually the quantum efficiencies stay constant; taking into account, however, the quantum deficits (e.g., the difference in energy between a blue photon and a red photon), the power efficiency increases with brightness, very similar in principle, but less prominent numerically, than in an incandescent lamp.

As a result the total light output from the phosphor-converted LED shifts blue as drive power to the blue or near-UV LED is increased, and shifts red as drive power to the blue or near-UV LED is decreased. In particular, the emissions of the exciting blue or near-UV LED and the two phosphors can combine to match, for example, a warm white (e.g., a CCT of about 3000 K) output at low drive powers to the blue or near-UV LED, i.e. at low light output. The increasing fraction of non-absorbed primary emission from the blue or near-UV LED adds to the primary (blue) component and/or to the excitation of the green or greenish/yellowish phosphor to shift the total emission spectrum of the phosphor-converted LED to higher CCT with increasing drive to the blue or near-UV LED. Correspondingly, the decreasing fraction of non-absorbed primary emission from the blue or near-UV LED shifts the total emission spectrum of the phosphor-converted LED to lower CCT with decreasing drive to the LED. The phosphor-converted LED thus exhibits ILD behavior with an essentially constant power efficiency (Watts light/Watts electricity) and with increased luminous efficiency (lumens/Watt) at higher power input.

Such phosphor-converted LEDs can be used individually for illumination, or two or more such phosphor-converted LEDs can be arranged in a common package or lamp. As elaborated on below, ILD behavior may be exhibited by direct current or pulsed current driven LEDs.

The semiconductor light emitting diode or laser diode may be, for example, a commercially available III-Nitride (e.g., GaN, AlInGaN) device emitting light with an emission peak between about 380 nanometers and about 460 nanometers, for example at about 390 nanometers in the near-UV or about 445 nanometers in the blue. Any suitable blue or near-UV light emitting diode or laser diode constructed in another material system may also be used. The normal operating output irradiance (power/area) range for a blue or near-UV light emitting diode employed in an ILD phosphor-converted LED as disclosed herein may be, for example, 0 to about 50 milliwatts/millimeter$^2$, 0 to about 100 milliwatts/millimeter$^2$, 0 to about 500 milliwatts/millimeter$^2$, 0 to about 1 Watt/millimeter$^2$, or 0 to >1 Watt/millimeter$^2$. The normal operating output irradiance range for a blue or near-UV laser diode employed in an ILD phosphor-converted LED as disclosed herein may be, for example, 0 to about 500 milliwatts/millimeter$^2$, 0 to about 1 Watt/millimeter$^2$, 0 to about 1.5 Watt/millimeter$^2$, or 0 to about 2 Watt/millimeter$^2$ (what is commonly called an HB or High Brightness LD), or 0 to >1 Watt/millimeter$^2$.

Figure 1A:
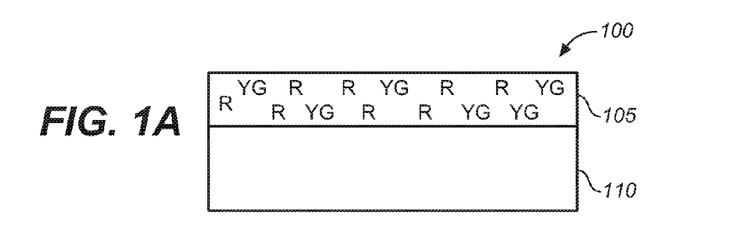
FIGS. 1A-1B show schematic diagrams of example phosphor-converted LEDs.

Preferably, the depletable red phosphor is arranged in a layer or slab disposed on or near to a surface of the LED through which the blue or near-UV primary emission is emitted. As shown in example phosphor-converted LED 100 of FIG. 1A, the green or yellow-green phosphor (YG) may be blended in with the red phosphor (R) in a single layer 105 disposed on or near LED 110. Alternatively, as shown in example phosphor-converted LED 120 of FIG. 1B, the red phosphor (R) may be arranged in a first layer or slab 125 disposed on or near LED 110 and the green or yellow-green phosphor arranged in a separate second layer or slab 130 disposed on or near to the first layer on the opposite side of the first layer from the LED. The phosphors may, for example, be dispersed as phosphor particles (i.e., as a powder) in an organic binder such as a silicone, an acrylic, or an epoxy, for example, and arranged in layers as just described. Additional scattering particles and/or nanoparticles that tailor the effective refractive index of the phosphor layer may also be dispersed in the binder to optimize performance of the phosphor-converted LED. Alternatively, it could be preferable to use an optically homogeneous phosphor layer, showing little light scattering. The high manufacturing temperatures of phosphors usually exclude this. In the case of depletable phosphors it is even more desirable, but by no means necessary, to use it in an optically homogeneous polycrystalline slab. As new classes of bleachable phosphors might become available, which can be made at much lower temperatures, the optimum optical arrangement might become feasible. Any other suitable arrangement of the phosphor materials with respect to the LED may also be used. Many package variants may be used with many different arrangements of the phosphors.

Generally, the green or yellow-green phosphor is selected to be excited by the blue or near-UV emission from the LED, or by emission from a phosphor excited by blue or near-UV light from the LED, and to provide a good white, high CRI (e.g., Ra, R9) value emission after being mixed with residual blue light from the LED, or with blue emission from a phosphor excited by (e.g., near-UV) light from the LED, and with red emission from the red phosphor. Suitable green or yellow-green phosphors may include, for example, YAG:Ce$^{3+}$ (Ce$^{3+}$ luminescent centers doped into a YAG host material), LuAG:Ce$^{3+}$, CaSc$_2$O$_4$:Ce$^{3+}$, other Ce$^{3+}$ doped materials, (Ba,Sr)$_2$SiO$_4$:Eu$^{2+}$, other Eu$^{2+}$ doped materials, other inorganic green or yellow-green phosphors, organic luminescent material, or quantum dots.

Generally, the ground-state depletable red phosphor is also selected to be excited by the blue or near-UV emission from the LED, or by emission from a phosphor excited by blue or near-UV light from the LED, and to provide a good white, high CRI (e.g., Ra, R9) value emission after being mixed with residual blue light from the LED, or with blue emission from a phosphor excited by (e.g., near-UV) light from the LED, and with emission from the yellow-green phosphor. A further consideration is luminous equivalent of the spectrum. The dimming behavior exhibited by these phosphor-converted LEDs is generally free of additional losses on a Watt/Watt basis. However, the subjective judgment is based on eye sensitivity, i.e., lumens/Watt. Choosing too red a red phosphor may reduce the lm/W, or luminous efficiency more than necessary.

Suitable ground state—depletable red phosphor luminescent centers may include, for example, rare earth ions with 4f-4f transitions such as for example Eu$^{3+}$, Pr$^{3+}$, and Sm$^{3+}$, and transition metal ions with 3d-3d transitions such as for example Mn$^{4+}$. These luminescent centers may be incorporated into any suitable host material. Typically the emission wavelengths depend to some extent on the host materials of the centers, but show no major shifts.

Suitable red phosphors may include, for example, phosphors satisfying the formula A$_x$[MF$_y$]:Mn$^{4+}$, where A is Li, Na, K, Rb, Cs, NR4, or a combination thereof; M is Si, Ge, Sn, Ti, Zr, Al, Ga, In, Sc, Y, La, Nb, Ta, Bi, Gd or a combination thereof; R is H, a lower alkyl, or a combination thereof; x is the absolute value of the charge of the [MF$_y$] ion; and y is 5, 6, or 7. For example, the phosphor may be or include K$_2$[SiF$_6$]:Mn$^{4+}$. Methods for preparing these phosphors are disclosed in U.S. Pat. No. 8,710,487, which is incorporated herein by reference in its entirety.

Other suitable depletable red phosphors may include, for example, phosphors satisfying the formula K$_2$[M$_{1-a}$Mn$^{4+}_a$F$_6$]; where M is at least one of Ti, Zr, Hf, Si, Ge, Sn; and 0<a<0.2. Methods for preparing these phosphors are disclosed in US Patent Publication 2015/0008463, which is incorporated herein by reference in its entirety.

Yet other suitable red phosphors may include, for example, SrAl$_{14}$O$_{25}$:Mn$^{4+}$, BaTiF$_6$:Mn$^{4+}$, and Na$_2$TiF$_6$:Mn$^{4+}$.

The most stringent criterion for choosing the depletable red emitter may be the excitation spectrum of the luminescent center, which is typically not very variable from host to host. It may be difficult to find a host in which Eu$^{3+}$, for example, has a suitable emission spectrum, suitable emission decay times, and is excitable by AlInGaN LEDs. Mn4+, however, is excellently matched to blue LEDs.

As noted above, the blue or near UV pump for an incandescent like dimming phosphor-converted LED might be a light emitting diode or a laser diode emitting at an appropriate wavelength. If a light emitting diode is employed, the bleachable red phosphor may typically have an emission lifetime of about 1 millisecond to about 10 milliseconds, for example. Irradiance levels reachable by laser diodes are higher than those reachable by light emitting diodes, so if a laser diode is employed the red phosphor may have a shorter emission lifetime and still exhibit the ground state depletion and bleaching that generate ILD behavior in the phosphor-converted LED. For laser excitation the red phosphor emission lifetime may be as low as 50 microseconds, or as low as 1 microsecond, for example.

In an ILD phosphor-converted LED comprising a blue or near-UV light emitting diode, a green or yellow-green phosphor, and a ground-state depletable red phosphor, typically the concentration of the green or yellow-green luminescent centers is for example about $2*10^{18}$/centimeter$^3$ to about $8*10^{20}$/centimeter$^3$, for example about $5*10^{19}$/centimeter$^3$. Typically the concentration of red luminescent centers is for example about $5*10^{18}$/centimeter$^3$ to about $5*10^{20}$/centimeter$^3$, for example about $3*10^{19}$/centimeter$^3$. If the depletable red luminescent center is Mn$^{4+}$ (e.g., in K$_2$[SiF$_6$]:Mn$^{4+}$) its concentration may be for example about 0.1% to about 6.5% (percentage of ions it replaces), which corresponds to a Mn$^{4+}$ concentration range of about $8*10^{18}$/centimeter$^3$ to about $5.2*10^{20}$/centimeter$^3$. If the green or yellow-green phosphor is Ce$^{3+}$ (e.g., in YAG:Ce$^{3+}$), its concentration may be for example 0.6% to about 6%, which corresponds to a Ce$^{3+}$ concentration range of about $8*10^{19}$/centimeter$^3$ to about $8*10^{20}$/centimeter$^3$.

The LED pump power at which the onset of ground state depletion for the red phosphor occurs depends on the red phosphor luminescent center absorption cross section and concentration, and on the geometrical arrangement of the red phosphor in relationship to the pump-LED and yellow-green phosphor. The particle size distributions of both phosphors and their relative positioning (mixing or layering) also influence the dimming behavior. The example ILD phosphor-converted LED performance described below with respect to FIGS. 2, 3A-3B, and 4, which present calculated results, assumes an optically homogenous slab or layer of red phosphor disposed on the LED, and a yellow-green phosphor either mixed into the red phosphor layer or disposed on the red phosphor layer in a second optically homogenous slab or layer.

The concentration of depletable red phosphor luminescent centers may be tuned according to the desired power range over which the phosphor-converted LED is intended to exhibit ILD behavior. Generally, ground state depletion of the red phosphor becomes significant as emission (photons/second) from the red phosphor approaches the concentration of red phosphor luminescent centers divided by the red phosphor luminescent center emission lifetime. (The longer the emission lifetime, the fewer the photons you can get out).

As a point of reference, it is interesting to estimate how much red light can be generated from a layer of ground-state depletable K$_2$SiF$_6$:Mn$^{4+}$ with an atomic concentration of $3*10^{20}$ Mn$^{4+}$/centimeter$^3$. Because Mn$^{4+}$ has a decay time of about 9 milliseconds, each ion can emit a maximum of about 100 photons/second. This gives a total of about $3*10^{20}$ photons emitted from a slab of 1 cm$^2$ area and 100 micron thickness. The photon energy is about 2 electron-Volts, so this converts to about 100 Watts, or for an arbitrary area to 100 Watts/centimeter$^2$, or 1 Watt from a typical high brightness chip having an emitting area of 1 millimeter$^2$. This estimate holds for arbitrarily high excitation irradiance. It is more difficult to estimate the lowest exciting irradiance, but >400 Watts/centimeter$^2$ is a good first order value for a sample with a high quantum efficiency.

As noted above, the light emitting diode or laser diode in an ILD phosphor-converted LED as disclosed herein may be driven with direct current. Under direct current drive, the CCT will be a function of the drive current. As the drive current is increased, blue or near-UV output will increase, the depletable red phosphor will bleach, and the CCT of the white output will increase.

Alternatively, the light emitting diode or laser diode in an ILD phosphor-converted LED as disclosed herein may be driven in a pulsed current mode by a train of pulses with a peak voltage $V_p$, a pulse-on time of $T_{on}$ and a repetition frequency $1/T_{period}$. Typically, the pulse-on time is selected to be longer than the emission lifetime of the depletable red phosphor to produce stable and predictable operation. Under pulsed current drive the CCT can be tuned for example by varying the instantaneous drive current as under direct current drive, or by varying the duty factor $T_{on}/T_{period}$ at constant instantaneous current in which case CCT increases with increasing duty factor. In both of these pulsed drive schemes the CCT increases as total light output increases (ILD behavior).

CCT can also be tuned under pulsed current drive by varying instantaneous drive current and duty factor together. This scheme may be used to change CCT at constant (time averaged) total light output power by concurrently increasing the instantaneous drive current (current pulse amplitude) and decreasing the duty factor or concurrently decreasing the instantaneous drive current and increasing the duty factor. Generally, moving from direct current (or high duty factor pulsed drive) to lower duty factor pulsed drive at the same time averaged total output power from the LED shifts the CCT to higher temperature. This is because to reach the same time-averaged output power, lower duty factor pulses must deliver higher instantaneous current than the higher duty factor pulses. The resulting blue or near-UV pulses from the LED have higher instantaneous irradiance at low duty factor than at high duty factor, and therefore more effectively bleach the depletable red phosphor at low duty factor than at high duty factor. As an example, driving a device comprising a depletable red phosphor (e.g., K$_2$[SiF$_6$]:Mn$^{4+}$ at a repetition rate of 25 Hertz with 20 millisecond pulses (a duty factor of ½) the instantaneous excitation of the red phosphor might be in the bleaching range. In contrast, under direct current drive at the same total output power the instantaneous excitation of the red phosphor might be below the onset of significant bleaching.

Figure 1B:
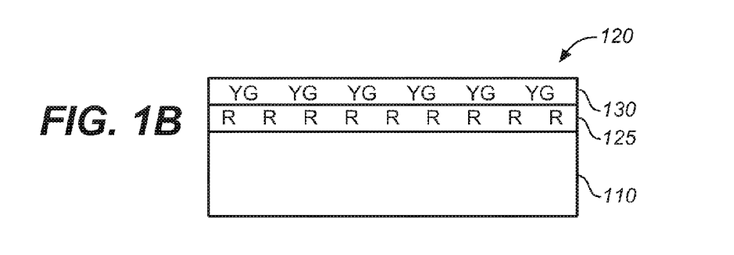
Figure 2:
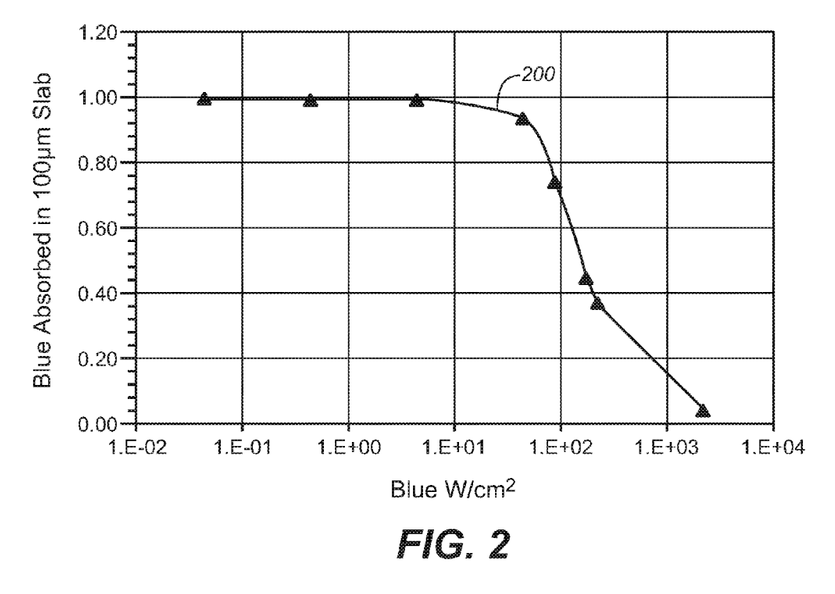
FIG. 2 shows a plot illustrating bleaching of a depletable red phosphor at high pump powers in an ILD phosphor-converted LED.

The plot in FIG. 2 illustrates bleaching of a depletable red phosphor at high pump powers in an ILD phosphor-converted LED comprising a GaN light emitting diode emitting blue light with a peak wavelength at about 450 nanometers, and a 100 micron thick layer of K$_2$[SiF$_6$]:Mn$^4$ phosphor material disposed on the light emitting diode (e.g., as in FIG. 1B). The concentration of Mn$^4$ in the phosphor layer is about $1*10^{20}$/centimeter$^3$. The horizontal axis measures the blue irradiance emitted into the phosphor layer. The vertical axis measures the relative amount of blue power absorbed by the red phosphor layer: (blue power emitted by the light emitting diode into the phosphor layer—blue power transmitted through the phosphor layer)/(blue power emitted by the light emitting diode into the phosphor layer). As curve 200 shows, at low blue irradiance all of the blue light is absorbed in the phosphor layer, but at higher blue irradiance the red phosphor begins to bleach and blue light is transmitted through the red phosphor layer. Significant bleaching occurs as the blue irradiance approaches about 100 Watts/centimeter$^2$, which is an irradiance typical at the surface of a high brightness blue light emitting diode. Curve 200 shifts along the horizontal scale with changes in the concentration of depletable red luminescent centers. (As the concentration is increased, curve 200 shifts to the right).

Figure 3A:
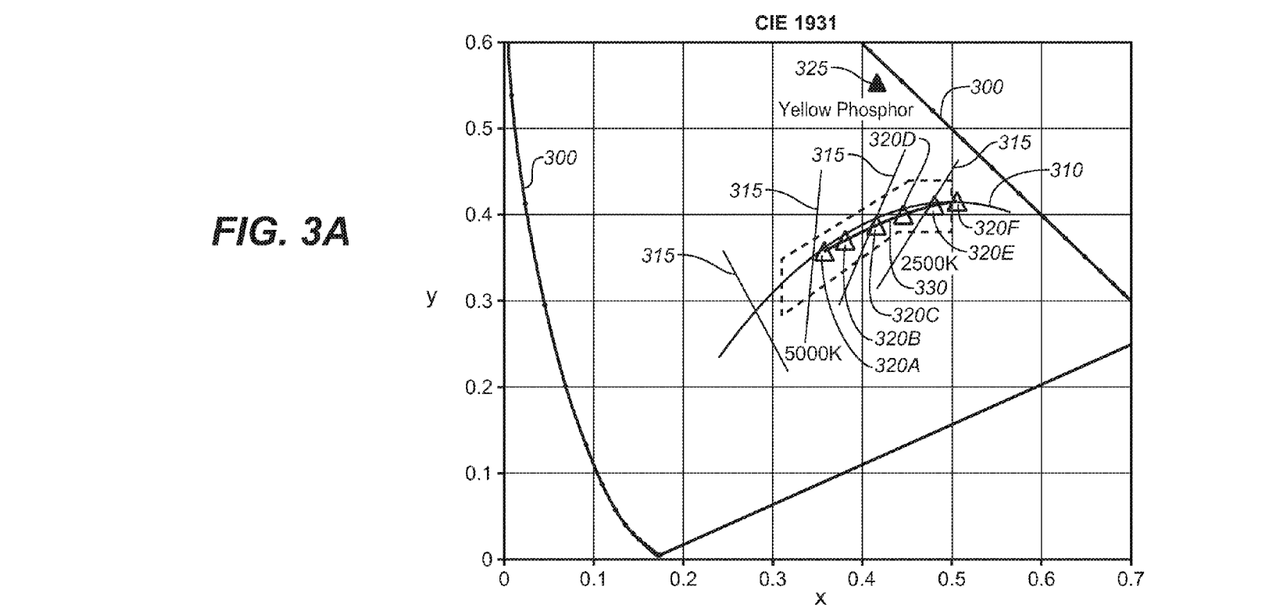
FIG. 3A shows a chromaticity diagram in which is plotted the location of the white output from an ILD phosphor-converted LED driven at six different drive powers.

FIG. 3A shows a CIE chromaticity diagram. The outer curved boundary 300 of the chromaticity diagram is the monochromatic locus. Curve 310 is the Planckian locus, which is the path through the chromaticity diagram that the color of an incandescent black body would take as its temperature changes. Lines 315 of constant CCT cross the Planckian locus.

Triangles 320A-320F plot the location of the white output from an ILD phosphor-converted LED driven at six different drive powers that result in six different CCT values ranging from about 4600 K at high power to about 2200 K at low power. The ILD phosphor-converted LED comprises a GaN light emitting diode emitting blue light with a peak wavelength at about 450 nanometers, a 250 micron thick layer of $K_2[SiF_6]:Mn^4$ red phosphor material disposed on the light emitting diode (e.g., as in FIG. 1B), and yellow-green $YAG:Ce^{3+}$ phosphor material. The $YAG:Ce^{3+}$ phosphor may be mixed into the red phosphor layer or disposed on the red phosphor layer in a second layer having a thickness of about 100 microns. The concentration of $Mn^4$ is about $1.6*10^{20}/$centimeter$^3$. The concentration of $Ce^{3+}$ is about $3.5*10^{20}/$centimeter$^3$. Triangle 325 plots the location of the yellow-green output from the $YAG:Ce^{3+}$ phosphor.

Figure 3B:
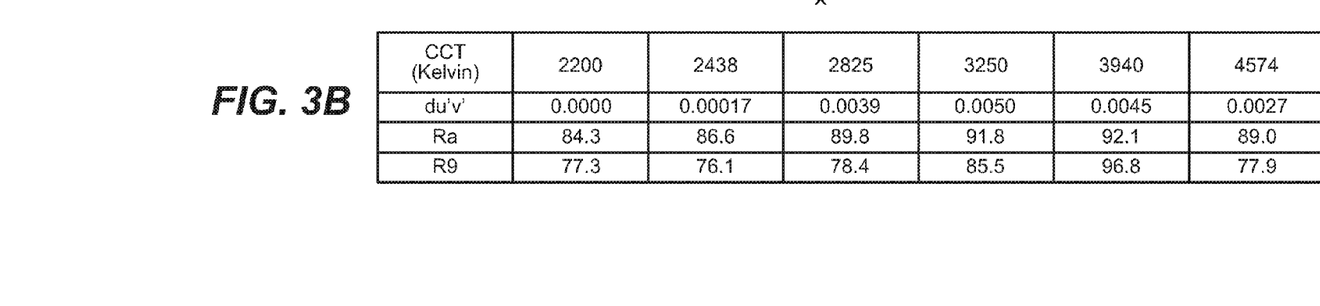
FIG. 3B shows a table summarizing additional properties of the ILD phosphor-converted LED white output at the locations plotted in FIG. 3A.

As shown in FIG. 3A, as the output of the ILD phosphor-converted-LED dims the CCT of its white output follows a path 330 through the chromaticity diagram generally from left to right (higher to lower CCT) close to and generally parallel to the Planckian locus. As a consequence, a human observer with normal color vision would observe the device to dim similarly to an incandescent light bulb. The table in FIG. 3B provides additional information about the white output from the ILD phosphor-converted LED at the six locations shown in the chromaticity diagram of FIG. 3A. Ra and R9 are color rendering indices. An Ra>80 and an R9 greater than 60 are generally considered good. du'v' is the deviation from the Planckian for the respective CCT. In the illustrated example, RA is greater than 80, R9 is greater than 60, or greater than 70, or greater than 75, and du'v' is ≤ about 0.0650 throughout the normal operating power range of the device.

Figure 4:
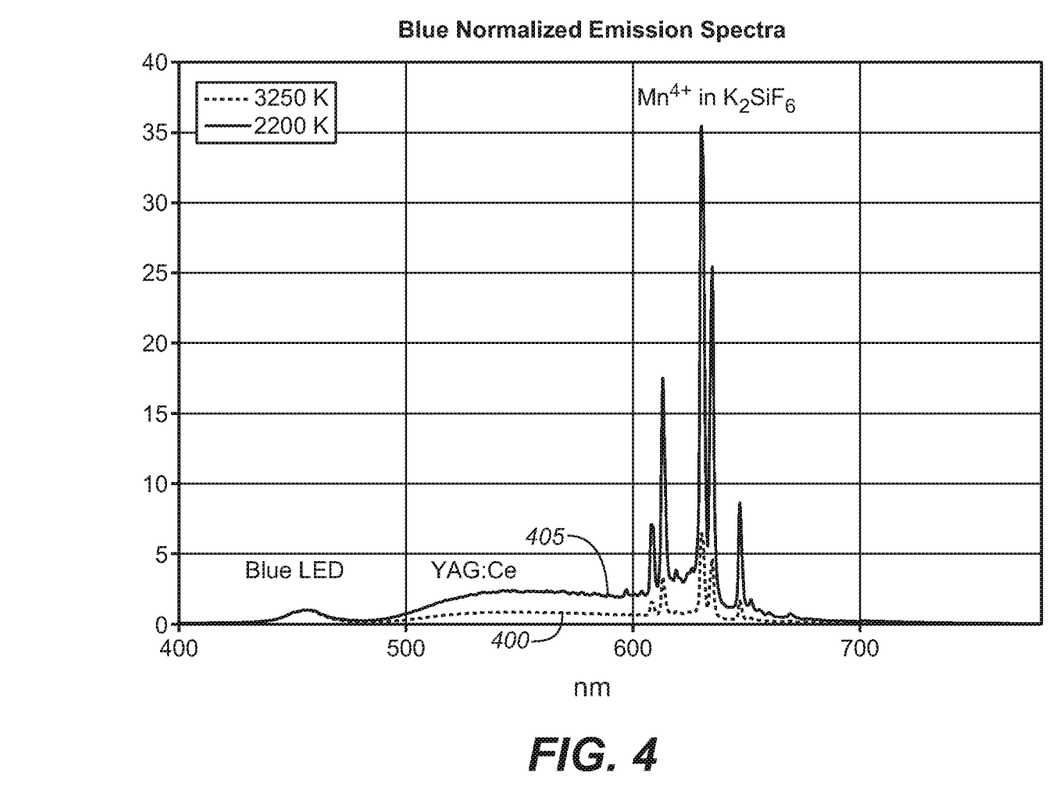
FIG. 4 shows two ILD phosphor-converted LED output spectra underlying the plot in FIG. 3A.

FIG. 4 shows two of the ILD-phosphor-converted LED output spectra underlying the plot in FIG. 3A. The spectra are normalized to the blue peak, which is the non-absorbed part of the (varied) blue pump, and indicate the locations of the blue light emitting diode emission, the $YAC:Ce^{3+}$ emission, and the $K_2SiF_6:Mn^{2+}$ emission. Spectrum 400 corresponds to triangle 320C (CCT of 3250 K) and spectrum 405 corresponds to triangle 320F (CCT of 2200 K) in FIG. 3A.

This disclosure is illustrative and not limiting. Further modifications will be apparent to one skilled in the art in light of this disclosure and are intended to fall within the scope of the appended claims. For example, a laser diode may be used to remotely excite a two (or more) phosphor mixture or stack of phosphor layers including a depletable red phosphor. Residual blue light transmitted by the phosphors may be reflected and mixed with the phosphor emissions.

What is claimed is:

1. A light emitting device comprising:
   an LED emitting blue light;
   a first phosphor excited by the blue light emitted by the LED and in response emitting green or greenish-yellow light; and
   a second phosphor excited by the blue light emitted by the LED and in response emitting red light, the second phosphor having a luminescence efficiency that is constant with excitation power from the LED;
   wherein the emission from the LED, the first phosphor, and the second phosphor combine to provide a white light output having a Correlated Color Temperature;
   wherein emission power from the first phosphor increases linearly with emission power from the LED; and
   wherein as emission power from the LED increases, emission power from the second phosphor saturates as a result of ground state depletion of the second phosphor and the second phosphor transmits an increasing fraction of the blue light thereby causing the Correlated Color Temperature of the white light output to increase as output power from the light emitting device increases.

2. The light emitting device of claim 1, wherein as excitation power from the LED increases the Correlated Color Temperature of the white light output increases from less than or equal to about 2500 K to greater than or equal to about 4500 K.

3. The light emitting device of claim 1, wherein the red emission from the second phosphor is from luminescent centers having an emission lifetime greater than or equal to about $10^{-4}$ seconds.

4. The light emitting device of claim 3, wherein the emission lifetime is greater than or equal to about $10^{-3}$ seconds.

5. The light emitting device of claim 4, wherein the red luminescent centers are $Mn^{4+}$ ions.

6. The light emitting device of claim 1, wherein:
   the LED is a III-Nitride light emitting diode;
   the first phosphor is or comprises $YAG:Ce^{3+}$; and
   the second phosphor is or comprises $K_2SiF_6:Mn^{4+}$.

7. A method of operating a light emitting device:
   wherein the light emitting device comprises:
   an LED emitting blue light;
   a first phosphor excited by the blue light emitted by the LED and in response emitting green or greenish-yellow light; and
   a second phosphor excited by the blue light emitted by the LED and in response emitting red light, the second phosphor having a luminescence efficiency that is constant with excitation power from the LED;
   wherein the emission from the LED, the first phosphor, and the second phosphor combine to provide a white light output having a Correlated Color Temperature, emission power from the first phosphor increases linearly with emission power from the LED, and as emission power from the LED increases, emission power from the second phosphor saturates as a result of ground state depletion of the second phosphor and the second phosphor transmits an increasing fraction of the blue light thereby causing the Correlated Color Temperature of the white light output to increase as output power from the light emitting device increases;
   the method comprising:
   driving the LED with direct current; and
   varying the direct current to vary the emission power from the light emitting device and the Color Correlated Temperature of the white light.

8. A method of operating a light emitting device:
   wherein the light emitting device comprises:
   an LED emitting blue light;
   a first phosphor excited by the blue light emitted by the LED and in response emitting green or greenish-yellow light; and
   a second phosphor excited by the blue light emitted by the LED and in response emitting red light, the second phosphor having a luminescence efficiency that is constant with excitation power from the LED;
   wherein the emission from the LED, the first phosphor, and the second phosphor combine to provide a white light output having a Correlated Color Temperature, emission power from the first phosphor increases linearly with emission power from the LED, and as emission power from the LED increases, emission power from the second phosphor saturates as a result of ground state depletion of the second phosphor and the second phosphor transmits an increasing fraction of the blue light thereby causing the Correlated Color Temperature of the white light output to increase as output power from the light emitting device increases;

the method comprising:

driving the LED with a current pulse train having a duty factor; and varying the duty factor to vary the emission power from the LED and the Color Correlated Temperature of the white light.

9. The method of claim 8, wherein each pulse in the pulse train has a duration longer than the emission lifetime of the second phosphor.

10. A light emitting device outputting white light having a Correlated Color Temperature, the light emitting device comprising:

an LED emitting blue or near-UV light;

a first phosphor excited by the light emitted by the LED and/or by light emitted by another phosphor excited by the LED and in response emitting green or greenish-yellow light; and a second phosphor excited by the light emitted by the LED, by the light emitted by the first phosphor, and/or by light emitted by another phosphor excited by the LED, and in response emitting red light, the second phosphor having a luminescence efficiency that is constant with excitation power;

wherein emission power from the first phosphor increases linearly with emission power from the LED; and wherein as emission power from the LED increases, emission power from the second phosphor saturates as a result of ground state depletion of the second phosphor and the second phosphor transmits an increasing fraction of the light impinging on it, thereby causing the Correlated Color Temperature of the white light to increase as output power from the light emitting device increases.

11. The light emitting device of claim 10, wherein as excitation power from the LED increases the Correlated Color Temperature of the white light output increases from less than or equal to about 2500 K to greater than or equal to about 4500 K.

12. The light emitting device of claim 10, wherein the red emission from the second phosphor is from luminescent centers having an emission lifetime greater than or equal to about $10^{-5}$ seconds.

13. The light emitting device of claim 12, wherein the emission lifetime is greater than or equal to about $10^{-4}$ seconds.

14. The light emitting device of claim 13, wherein the red luminescent centers are $Mn^{4+}$ ions.

15. The light emitting device of claim 10, wherein:

the LED is a III-Nitride light emitting diode;

the first phosphor is or comprises $YAG:Ce^{3+}$; and the second phosphor is or comprises $K_2SiF_6:Mn^{4+}$.

16. A method of operating a light emitting device:

wherein the light emitting device comprises:

an LED emitting blue or near-UV light;

a first phosphor excited by the light emitted by the LED and/or by light emitted by another phosphor excited by the LED and in response emitting green or greenish-yellow light; and a second phosphor excited by the light emitted by the LED, by the light emitted by the first phosphor, and/or by light emitted by another phosphor excited by the LED, and in response emitting red light, the second phosphor having a luminescence efficiency that is constant with excitation power;

wherein emission power from the first phosphor increases linearly with emission power from the LED, as emission power from the LED increases, emission power from the second phosphor saturates as a result of ground state depletion of the second phosphor and the second phosphor transmits an increasing fraction of the light impinging on it, thereby causing the Correlated Color Temperature of the white light to increase as output power from the light emitting device increases;

the method comprising:

driving the LED with direct current; and varying the direct current to vary the emission power from the light emitting device and the Color Correlated Temperature of the white light.

17. A method of operating a light emitting device:

wherein the light emitting device comprises:

an LED emitting blue or near-UV light;

a first phosphor excited by the light emitted by the LED and/or by light emitted by another phosphor excited by the LED and in response emitting green or greenish-yellow light; and a second phosphor excited by the light emitted by the LED, by the light emitted by the first phosphor, and/or by light emitted by another phosphor excited by the LED, and in response emitting red light, the second phosphor having a luminescence efficiency that is constant with excitation power;

wherein emission power from the first phosphor increases linearly with emission power from the LED, as emission power from the LED increases, emission power from the second phosphor saturates as a result of ground state depletion of the second phosphor and the second phosphor transmits an increasing fraction of the light impinging on it, thereby causing the Correlated Color Temperature of the white light to increase as output power from the light emitting device increases;

the method comprising:

driving the LED with a current pulse train having a duty factor; and varying the duty factor to vary the emission power from the LED and the Color Correlated Temperature of the white light.

18. The method of claim 17, wherein each pulse in the pulse train has a duration longer than the emission lifetime of the second phosphor.

19. A method of operating a light emitting device outputting white light having a Correlated Color Temperature:

wherein the light emitting device comprises:

an LED;

an LED driver supplying drive current to the LED in a train of current pulses having a duty factor, each current pulse having an amplitude, the LED in response emitting a corresponding train of blue or near-UV light pulses;

a first phosphor excited by the light emitted by the LED and/or by light emitted by another phosphor excited by the LED and in response emitting greenish-yellow light; and a second phosphor excited by the light emitted by the LED, by the light emitted by the first phosphor, and/or by light emitted by another phosphor excited by the LED, and in response emitting red light, the second phosphor having a luminescence efficiency that is constant with excitation power;

wherein emission power from the first phosphor increases linearly with the current pulse amplitude of the drive current supplied to the LED; and wherein as the current pulse amplitude of the drive current supplied to the LED increases, emission power from the second phosphor saturates as a result of ground state depletion of the second phosphor and the second phosphor transmits an increasing fraction of the light impinging on it;

the method comprising concurrently varying the current pulse amplitude and the duty factor to maintain a constant white light output power from the light emitting device while varying the Correlated Color Temperature of the white light.

20. The method of claim 19, wherein the red emission from the second phosphor is from bleachable luminescent centers having an emission lifetime greater than or equal to about $10^{-5}$ seconds.

21. The method of claim 19, wherein the emission lifetime is greater than or equal to about $10^{-3}$ seconds.

22. The method of claim 20, wherein the bleachable red luminescent centers are $Mn^{4+}$, $Eu^{3+}$, $Tb^{3+}$, or $Pr^{3+}$ ions.

23. The light emitting device of claim 19, wherein:
the LED is a III-Nitride light emitting diode;
the first phosphor is or comprises $YAG:Ce^{3+}$; and
the second phosphor is or comprises $K_2SiF_6:Mn^{4+}$.

* * * * *